(12) United States Patent
Annunziata et al.

(10) Patent No.: US 9,691,972 B1
(45) Date of Patent: Jun. 27, 2017

(54) LOW TEMPERATURE ENCAPSULATION FOR MAGNETIC TUNNEL JUNCTION

(71) Applicants: International Business Machines Corporation, Armonk, NY (US); Tokyo Electron Limited, Tokyo (JP)

(72) Inventors: Anthony J. Annunziata, Stamford, CT (US); Sebastian U. Engelmann, White Plains, NY (US); Eric A. Joseph, White Plains, NY (US); Gen P. Lauer, Yorktown Heights, NY (US); Nathan P. Marchack, White Plains, NY (US); Deborah A. Neumayer, Danbury, CT (US); Masahiro Yamazaki, Elmsford, NY (US)

(73) Assignees: INTERNATIONAL BUSINESS MACHINES CORPORATION, Armonk, NY (US); TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/976,339

(22) Filed: Dec. 21, 2015

(51) Int. Cl.
*H01L 43/12* (2006.01)
*H01L 27/22* (2006.01)
*H01L 43/02* (2006.01)
*H01L 43/08* (2006.01)

(52) U.S. Cl.
CPC .......... *H01L 43/12* (2013.01); *H01L 27/222* (2013.01); *H01L 43/02* (2013.01); *H01L 43/08* (2013.01)

(58) Field of Classification Search
CPC .......... H01L 43/02; H01L 43/08; H01L 43/12; H01L 27/222
See application file for complete search history.

(56) References Cited

U.S. PATENT DOCUMENTS

| 2001/0028100 A1* | 10/2001 | Schmitz | H01L 23/3171 257/649 |
| 2006/0054947 A1* | 3/2006 | Asao | H01L 43/12 257/295 |
| 2006/0084283 A1 | 4/2006 | Paranjpe et al. | |
| 2006/0199357 A1* | 9/2006 | Wan | C23C 16/345 438/482 |

(Continued)

OTHER PUBLICATIONS

Lee et al., "Development of Low Temperature Silicon Nitride and Silicon Dioxide Films by Inductively-Coupled Plasma Chemical Vapor Deposition", J. Electrochem. Soc. 2000 147(4): 11 pages.

(Continued)

*Primary Examiner* — Fei Fei Yeung Lopez
(74) *Attorney, Agent, or Firm* — Cantor Colburn LLP; Louis Percello

(57) ABSTRACT

A method of making a magnetic random access memory device comprises forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; and depositing an encapsulating layer on and along sidewalls of the magnetic tunnel junction at a temperature of 40 to 60° C. using remote microwave plasma deposition wherein the encapsulation layer comprises silicon and nitrogen. An MRAM device made by the aforementioned method is also disclosed.

20 Claims, 8 Drawing Sheets

(56) References Cited

U.S. PATENT DOCUMENTS

2009/0294881 A1* 12/2009 Murata ................. B82Y 25/00
                                                    257/421
2013/0189853 A1   7/2013 Yang et al.

OTHER PUBLICATIONS

Ovanesyan et al., "Low-Temperature Conformal Atomic Layer Deposition of SiNx Films Using Si2Cl6 and NH3 Plasma", ACS Applied Materials & Interfaces, 2015, 7, pp. 10806-10813.
Triyoso et al., "Evaluation of Low Temperature Silicon Nitride Spacer for High-k Metal Gate Integration", ECS J. Solid State Sci. Technol. 2013 2(11): pp. N222-N227.

* cited by examiner

LOW TEMPERATURE ENCAPSULATION FOR MAGNETIC TUNNEL JUNCTION

BACKGROUND

Spin-transfer torque magnetoresistive random access memory devices have some benefits over semiconductor-based memories, such as dynamic random-access memory (DRAM) and static random-access memory (SRAM). However, in order to compete with dynamic random-access memory and static random-access memory, the spin-transfer torque magnetoresistive random access memory devices need to be integrated into the wiring layers of standard silicon logic and memory chips.

Spin-transfer torque magnetoresistive random access memory device is a type of solid state, non-volatile memory that uses tunneling magnetoresistance (TMR or MR) to store information. Magnetoresistive random access memory (MRAM) includes an electrically connected array of magnetoresistive memory elements, referred to as magnetic tunnel junctions (MTJs). Each magnetic tunnel junction includes a free layer and fixed/reference layer that each includes a magnetic material layer. A non-magnetic insulating tunnel barrier separates the free and fixed/reference layers. The free layer and the reference layer are magnetically de-coupled by the tunnel barrier. The free layer has a variable magnetization direction, and the reference layer has an invariable magnetization direction.

A magnetic tunnel junction stores information by switching the magnetization state of the free layer. When magnetization direction of the free layer is parallel to the magnetization direction of the reference layer, the magnetic tunnel junction is in a low resistance state. Conversely, when the magnetization direction of the free layer is antiparallel to the magnetization direction of the reference layer, the magnetic tunnel junction is in a high resistance state. The difference in resistance of the MTJ may be used to indicate a logical '1' or '0', thereby storing a bit of information. The tunneling magnetoresistance of a magnetic tunnel junction determines the difference in resistance between the high and low resistance states. A relatively high difference between the high and low resistance states facilitates read operations in the MRAM.

SUMMARY

Disclosed herein is a method of making a magnetic random access memory device. The method comprises forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; and depositing an encapsulating layer on and along sidewalls of the magnetic tunnel junction at a temperature of 40 to 60° C. using remote microwave plasma deposition wherein the encapsulation layer comprises silicon and nitrogen.

Also disclosed herein is a method of making a magnetic random access memory device, the method comprising: forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; and depositing an encapsulating layer on and along sidewalls of the magnetic tunnel junction, wherein the encapsulation layer is formed from $SiH_4$ and $NH_3$ at a temperature of 40 to 60° C. using remote microwave plasma deposition.

According to yet another embodiment of the invention, an MRAM device includes: a magnetic tunnel junction arranged on an electrode, the magnetic tunnel junction comprising a reference layer positioned in contact with the electrode, a tunnel barrier layer arranged on the reference layer, and a free layer arranged on the tunnel barrier layer; and an encapsulating layer disposed on and along sidewalls of the magnetic tunnel junction, wherein the encapsulating layer comprises silicon and nitrogen and is formed by remote microwave plasma deposition at a temperature of 40 to 60° C.

BRIEF DESCRIPTION OF THE DRAWINGS

The subject matter, which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One challenge of integrating spin-transfer torque magnetoresistive random access memory devices into the wiring layers of silicon logic and memory chips is encapsulating the spin-transfer torque magnetoresistive random access memory device after patterning. The spin-transfer torque magnetoresistive random access memory device including a magnetic tunnel junction is encapsulated so that the magnetic layers and tunnel barrier layer experience minimal degradation during subsequent processing. Encapsulation of the MRAM device can protect the magnetic tunnel junction during subsequent processing. However, the deposition process can degrade the device's magnetic properties if carried out high temperatures. Lower deposition temperatures have been proposed for methods such as plasma enhanced chemical vapor deposition (PECVD) and plasma enhanced atomic layer deposition (PE-ALD) however the lower temperatures can compromise the quality of the film or introduce potentially damaging precursors such as halogenated precursors.

Physical sputter methods can also employ temperatures below 200° C. but the throughput rate is low because the deposition rate scales with power and higher power can induce degradation.

These issues have been addressed by forming an encapsulating layer using remote microwave plasma deposition. The encapsulating layer is formed at a temperature substantially below 200° C., typically 40 to 60° C. The encapsulating layer is formed without using potentially damaging precursors. Furthermore, the encapsulating layer has a strong signal for endpoint detection in etching—stronger than the signal for comparable materials made at 150° C. Finally, the encapsulating layer made as described herein has improved coercive field (Hc) and energy barrier (Eb) characteristics compared to similar materials deposited at 200° C. using plasma enhanced chemical vapor deposition. The coercive field is important because it is indicative of data retention in MRAM devices. Data retention in MRAM devices is proportional to coercive field (Hc). As a device gets small, Hc should increase in order to maintain data retention, but in fact Hc tends to decrease as the device becomes smaller. A method of maintaining Hc or minimizing Hc loss at smaller device size allows for smaller devices with minimal loss in data retention.

The embodiments provide methods of encapsulating devices for perpendicularly magnetized spin-transfer torque magnetoresistive random access memory. The disclosed processes improve device characteristics and reduce magnetic degradation at small device diameters (e.g., <50 nm).

Figure 1:
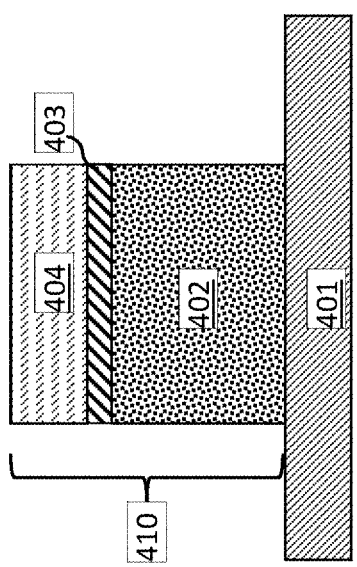
FIG. 1 is a cross-sectional side view of a patterned magnetic tunnel junction stack positioned on a contact electrode.

FIGS. 1-5 illustrate exemplary methods of making MRAM devices according to various embodiments. FIG. 1 is a cross-sectional side view of a patterned magnetic tunnel junction stack 410 positioned on a contact electrode 401. The magnetic tunnel junction stack 410 includes a reference layer 402, a tunnel barrier layer 403, and a free layer 404.

The contact electrode 401 includes a conductive material(s) and forms the bottom contact electrode of the MRAM device. Non-limiting examples of conductive materials for the contact electrode include tantalum, tantalum nitride, titanium, or any combination thereof.

The contact electrode 401 may be formed by depositing a conductive material(s) onto a surface. The conductive material(s) may be deposited by, for example, physical vapor deposition (PVD), ion beam deposition (IBD), atomic layer deposition (ALD), electroplating, or other like processes.

To form the magnetic tunnel junction stack 410, the reference layer 402 is formed on the contact electrode 401; the tunnel barrier layer 403 is formed on the reference layer 402; and the free layer 404 is formed on the tunnel barrier layer 403.

The reference layer 402 and the free layer 404 include conductive, magnetic materials, for example, metals or metal alloys. The reference layer 402 and the free layer 404 may be formed by employing a deposition process, for example, PVD, IBD, ALD, electroplating, or other like processes.

The reference layer 402 and the free layer 404 may include one layer or multiple layers. The reference layer 402 and the free layer 404 may include the same materials and/or layers or different materials and/or layers.

Non-limiting examples of materials for the reference layer 402 and/or the free layer 104 include iron, cobalt, boron, aluminum, nickel, silicon, oxygen, carbon, zinc, beryllium, vanadium, boron, magnesium, or any combination thereof.

The reference layer 402 has a thickness that may generally vary and is not intended to be limited. In some embodiments, the reference layer 102 has a thickness 10 to 25 nm. In other embodiments, the reference layer 402 has a thickness of 2 to 10 nm.

The free layer 404 has a thickness that may generally vary and is not intended to be limited. In some embodiments, the free layer 404 has a thickness of 2 to 5 nm. In other embodiments, the free layer 404 has a thickness of 1 to 2 nm.

The tunnel barrier layer 403 includes a non-magnetic, insulating material. A non-limiting example of an insulating material for the tunnel barrier layer 403 is magnesium oxide (MgO). The tunnel barrier layer 403 may be formed on the reference layer 402 by, for example, radiofrequency (RF) sputtering in some embodiments. Alternatively, the tunnel barrier layer 403 is formed by oxidation (e.g., natural or radical oxidation) of a magnesium (Mg) layer deposited on the reference layer 402. After oxidation, the MgO layer may then be capped with a second layer of Mg. The thickness of the tunnel barrier layer 403 is not intended to be limited and may generally vary.

After depositing the magnetic tunnel junction stack 410 layers on the contact electrode 401, the magnetic tunnel junction stack 410 is patterned. In some embodiments, a hard mask material layer may be disposed on the magnetic tunnel junction stack 410. The hard mask material layer is then patterned by etching, for example, using a reactive ion etch (ME) process or a halogen-based chemical etch process (e.g., including chlorine-containing gas and/or fluorine-containing gas chemistry). The pattern from the hard mask is transferred into the free layer 404, tunnel barrier layer 403, and reference layer 401. The free layer 404, tunnel barrier layer 403, and reference layer 402 are etched by, for example, performing a MRAM stack etch process. The stack etch process may be a ME process or an ion beam etch (IBE) process.

Figure 2:
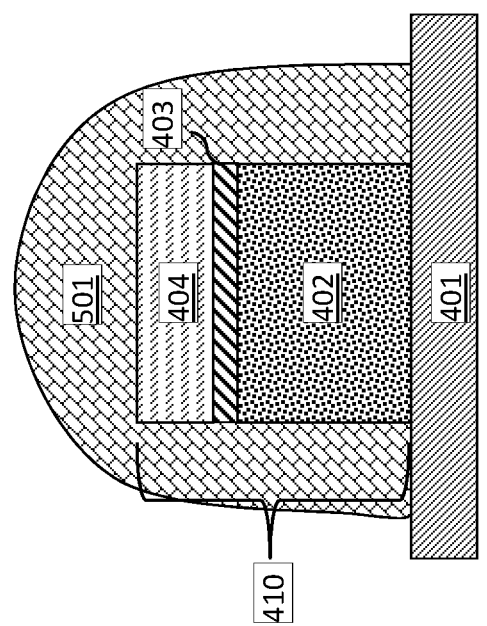
FIG. 2 is a cross-sectional side view after depositing an encapsulating layer on the magnetic tunnel junction stack.

FIG. 2 is a cross-sectional side view after depositing an encapsulating layer 501 on the magnetic tunnel junction stack 410. The encapsulating layer 501 comprises $SiN_x$, wherein x is the ratio of N to Si and x is 0.2 to 1.3. The encapsulating layer 501 encapsulates the magnetic tunnel junction stack 410. The encapsulating layer 501 is deposited on the exposed surface and sidewalls of the magnetic tunnel junction stack 410 and contacts the contact electrode 401.

The thickness of the encapsulating layer 501 may generally vary and is not intended to be limited. In some embodiments, the thickness of the encapsulating layer 501 is 10 to 60 nm. In other embodiments, the thickness of the encapsulating layer 501 is 20 to 40 nm. To achieve a desired encapsulating layer thickness of, for example, silicon nitride, several cycles of deposition may be performed.

The encapsulating layer 501 is deposited by remote microwave plasma deposition. In remote microwave plasma deposition one or more ammonia gases are subjected to microwave radiation. The irradiated gas or gases are then reacted at a temperature of 40 to 60° C. and the reaction product is deposited on the magnetic tunnel junction stack 410.

Figure 3:
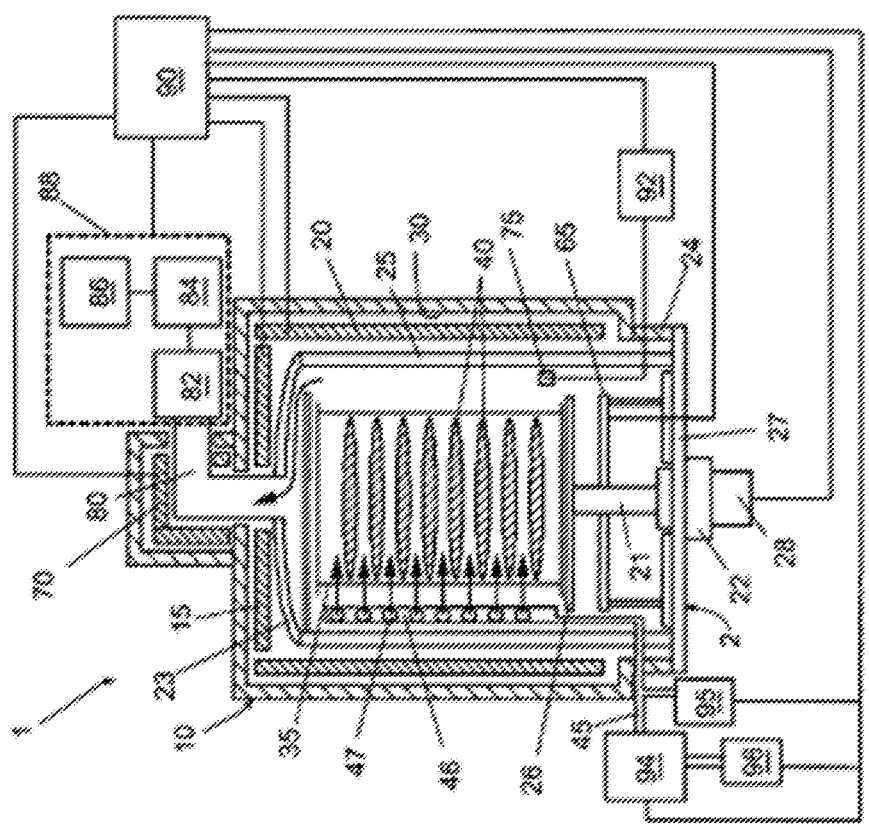
FIG. 3 shows a simplified block diagram of a batch type processing system for remote microwave plasma deposition of a material comprising silicon and nitrogen.

FIG. 3 shows a simplified block diagram of an exemplary batch-type processing system for remote microwave plasma deposition of a silicon-nitrogen-containing film on a magnetic tunnel junction stack. The batch-type processing system 1 contains a process chamber 10 and a process tube 25 therein that has an upper end 23 connected to a exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined reduced pressure in the processing system 1. A substrate holder 35 for holding a plurality of magnetic tunnel junction stacks is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the reaction tube 25. When the lid 27 is positioned at its uppermost position, the lid 27 is adapted to close the open end of the manifold 2.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) is formed in the wall of the process chamber 10 as a cooling medium passage.

The batch-type processing system 1 contains a gas delivery system that includes a gas supply line 45. The gas supply line 45 is connected to silane gas source 95 and remote plasma source 94. A remote plasma source refers to a plasma source that is positioned remote from the process chamber, i.e., outside of the chamber in which the substrate will be processed, such that the excited gas must thereafter be delivered to the process chamber. The silane gas source 95 can be further mixed with an inert carrier gas such as argon (Ar). Alternatively, if the vapor pressure of the silane gas is high enough, a bubbling system that utilizes and an inert carrier gas can be used instead. The remote plasma source 94 is configured for exciting ammonia gas from the ammonia gas source 96. The remote plasma source 94 is a microwave plasma source where the microwave power can be 1000 Watts (W) to 6,000 W. The microwave frequency can, for example, be 2.45 GHz.

The excited ammonia gas is mixed with silane gas from the gas source 95 in the gas supply line 45 downstream from the remote plasma source 94. The resulting excited gas mixture is then flowed into the reaction tube 25 of the process chamber 10. Though not specifically shown, it is also contemplated that the excited ammonia gas from remote plasma source 94 may be mixed with the silane gas from gas source 95 downstream of the remote plasma source 94 but inside the process chamber 10 prior to introducing the excited gas mixture to the reaction tube 25. In the embodiment illustrated in FIG. 3, the gas delivery system further contains a gas injection system 46. The excited gas mixture exits the gas injection system 46 through a plurality of holes 47 and flows over the substrates 40, thereby depositing a silicon-nitrogen-containing film on the magnetic tunnel junction stacks.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, the process pressure can be adjusted by the APC 82. The trap 84 can collect unreacted precursor material and reaction by-products from the process chamber 10.

The process monitoring system 92 comprises a sensor 75 capable of real-time process monitoring and can, for example, comprise a mass spectrometer (MS) or a Fourier transform infrared (FTIR) spectrometer. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas sources 95 and 96, remote plasma source 94, motor 28, process monitoring system 92, heaters 20, 15, 65, and 70, and vacuum pumping system 88.

Figure 4:
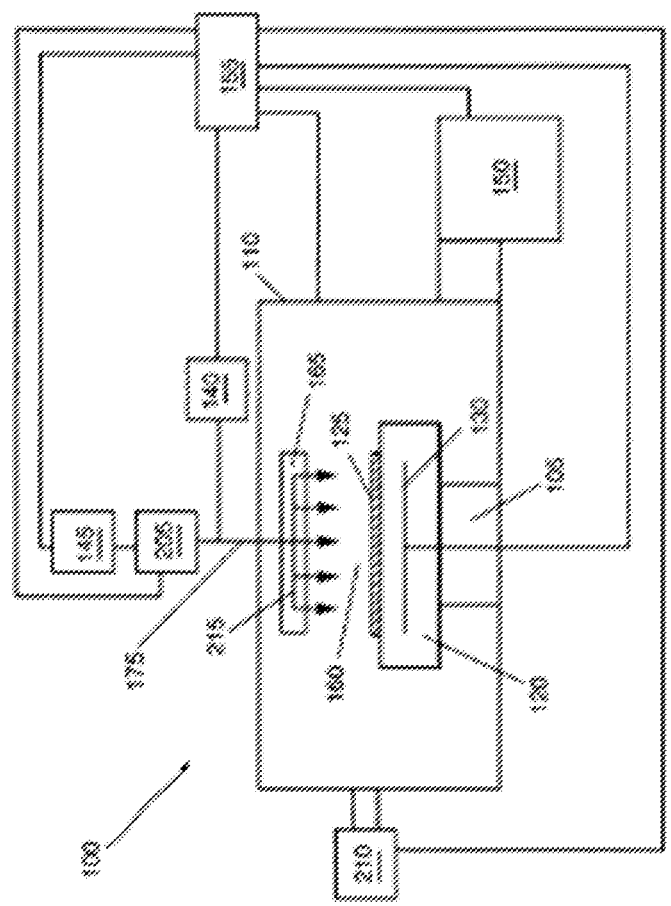
FIG. 4 shows a simplified block diagram of a single sample type processing system for remote microwave plasma deposition of a material comprising silicon and nitrogen.

FIG. 4 shows a simplified block diagram of a processing system for remote microwave plasma deposition of a silicon-nitrogen-containing film on a magnetic tunnel junction stack according to another embodiment of the invention. The processing system 100 includes a process chamber 110 having a pedestal 105 for mounting a holder 120 that supports a magnetic tunnel junction stack 125 and exposes the magnetic tunnel junction stack 125 to the processing region 160. The substrate holder 120 can be further configured for heating or cooling the substrate 125.

Ammonia gas from ammonia supply 145 is flowed into the remote plasma source 205 configured for plasma exciting the ammonia gas. The remote plasma source 205 is a microwave plasma source where the microwave power can be 1000 Watts (W) to 6,000 W. The microwave frequency can, for example, be 2.45 GHz. Downstream from the remote plasma source 205, a gas source 140 supplies a silane gas that is mixed with the excited ammonia gas in a gas delivery system containing a gas supply line 175. Analogously, as described above for FIG. 1, the gas source 140 can include a liquid delivery system or a bubbling system. The resulting excited gas mixture 215 is then flowed into the process chamber 110. The excited gas mixture 215 can be introduced to the processing region 160 in the process chamber 110 using the gas delivery system that further contains a gas injection plenum (not shown), a series of baffle plates (not shown) and a multi-orifice showerhead gas injection plate 165. Though not specifically shown, it is also contemplated that the excited ammonia gas from the remote plasma source 205 may be mixed with the silane gas from gas source 140 downstream of the remote plasma source 205 but inside the process chamber 110 prior to introducing the excited gas mixture 215 to the processing region 160. The process chamber 110 is connected to vacuum pump system 150 that can include a turbo-molecular vacuum pump (TMP) capable of a pumping speed up to about 5,000 liters per second (and greater), and a gate valve for controlling the gas pressure.

Figure 5:
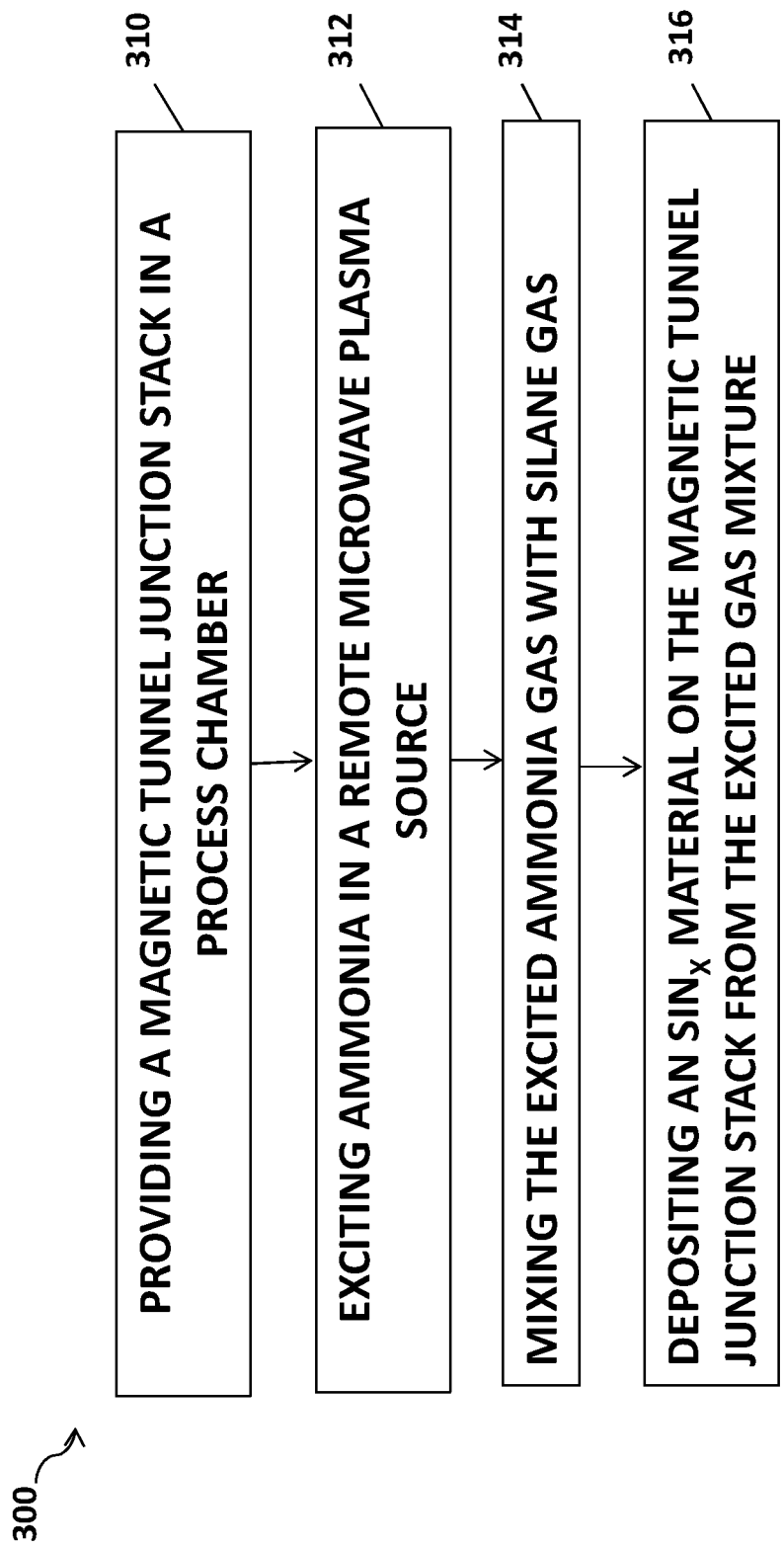
FIG. 5 is a flow diagram for remote microwave plasma deposition of a material comprising silicon and nitrogen.

FIG. 5 is a flow diagram for remote microwave plasma deposition of a silicon-nitrogen-containing film on a magnetic tunnel junction stack. The process 300 includes providing a substrate in a process chamber at 310. The process chamber can, for example, be one of the process chambers 1 or 100 shown in FIGS. 3 and 4, respectively.

At 312, ammonia gas is flowed into and excited in a remote plasma source. At 314, the plasma-excited ammonia gas is mixed with silane gas downstream from the remote plasma source. At 316, a silicon-nitrogen-containing film is deposited on the magnetic tunnel junction stack in the process chamber from the excited gas mixture in a chemical vapor deposition process.

The formation of the excited ammonia gas in the remote plasma source is separated from the actual mixing of the excited ammonia gas with the silane gas. This separation can provide greater control over the deposition process, the composition of the silicon-nitrogen-containing film, and the film properties. The excited ammonia gas contains radicals (e.g., $N^*$, $NH_x^*$) which, when mixed with the silane gas, allow for lowering of the deposition temperature.

In one embodiment of the invention, the ammonia gas can contain a nitrogen-containing gas and the deposited silicon-nitrogen-containing film can further contain hydrogen. The nitrogen-containing gas can include $N_2$, $NH_3$, $N_2H_2$, NO, or $N_2O$, or a combination of two or more thereof. The nitrogen-containing gas can, for example, have a gas flow rate to the plasma source 10 sccm to 50 sccm.

In one embodiment of the invention, the excited gas mixture can further contain an inert gas, for example He, Ne, Ar, Kr, or Xe, or a combination of two or more thereof. The inert gas flow rate to the plasma source can, for example, be 50 sccm to 2500 sccm. Processing conditions used for depositing a silicon-nitrogen-containing film can include a process chamber pressure of 10 mTorr to 150 Torr. The process conditions can further include a substrate temperature of 40° C. to 60° C.

Remote microwave plasma deposition at temperatures of 40 to 60° C. using silane and ammonia as reactant cases results in the formation of an encapsulation layer on a magnetic tunnel junction without increasing the temperature to a point at which degradation of the magnetic tunnel junction would occur. Additionally the resulting encapsulating layer has superior etch resistance, coercivity and energy barrier properties compared to encapsulating layers made by other methods. Furthermore, encapsulating layers having an increasing refractive index appear to have better etch resistance. The resulting MRAM device has better data retention that other MRAM devices having an encapsulating layer made by a high temperature method.

In some embodiments the MRAM device can undergo further processing. The further processing can include embedding the encapsulated device into the back-end-of-line (BEOL) of a CMOS process route. The encapsulated device may undergo additional processing after the BEOL of the CMOS route.

EXAMPLES

Examples 1-3

Table 1 shows the conditions for remote microwave plasma deposition three different examples. The three examples are referred to by their respective refractive indices. The deposition substrate was silicon. The deposition temperature was 60° C. The deposition time was 60 seconds. The pressure was 90 milliTorr (mTorr). The microwave power was 4000 Watts (W). The gas flows are in standard cubic centimeter per unit time (sccm). Results are shown in Table 2. The deposition rate is in Angstroms per second (A/s). The refractive index of the deposited material is abbreviated as RI. The etch rate when exposed to hydrogen fluoride is expressed in Angstroms per second (A/s) and Angstroms per minute (A/m).

TABLE 1

|  | $SiH_4$ | $NH_3$ | Ar | He |
|---|---|---|---|---|
| SiN 2.4 | 20 | 19 | 850 | 1000 |
| SiN 2.2 | 20 | 22 | 850 | 1000 |
| SiN 1.9 | 20 | 35 | 850 | 1000 |

TABLE 2

|  | Deposition rate A/s | Refractive index | 100:1 HF etch rate A/s | 100:1 HF etch rate A/min |
|---|---|---|---|---|
| $SiN_x$ 2.4 | 13.9 | 2.39 | 0.5 | 31 |
| $SiN_x$ 2.2 | 15.1 | 2.22 | 0.5 | 31 |
| $SiN_x$ 1.9 | 17.3 | 1.91 | 1.8 | 110 |

As can be seen from the examples, the $SiN_x$ materials with a higher refractive index showed an increased resistance to etching when exposed to hydrogen fluoride.

Figure 6:
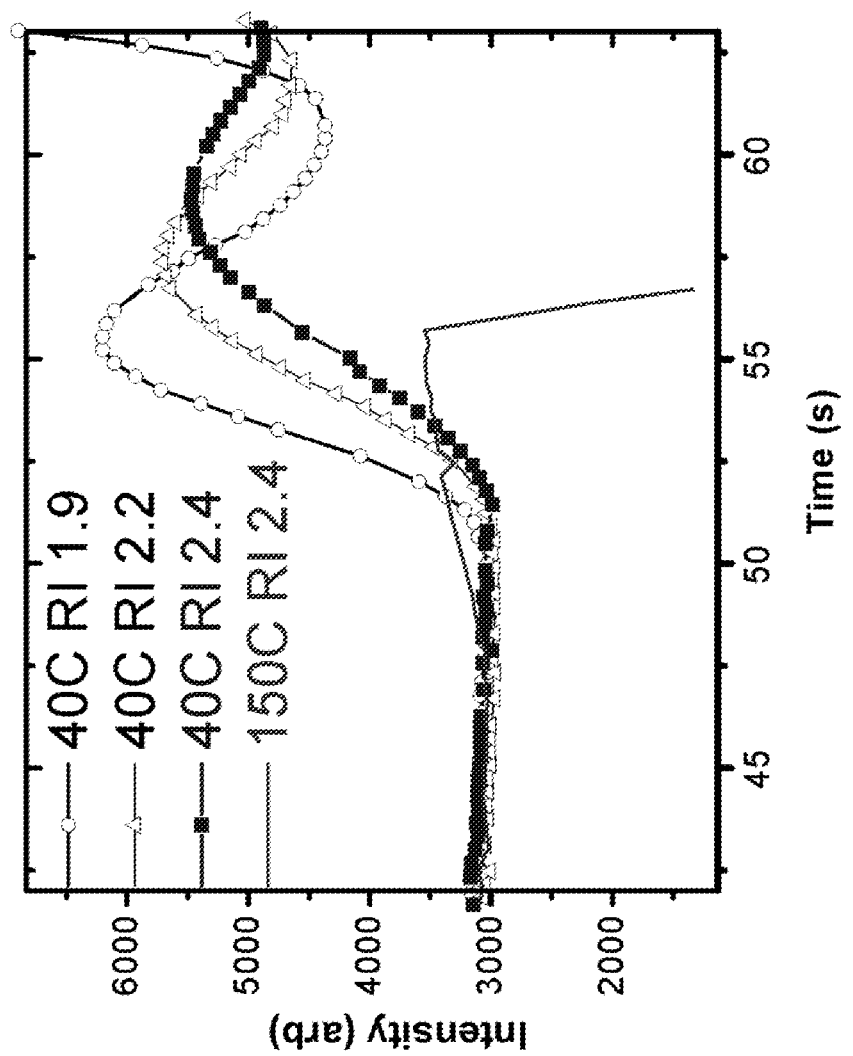
FIG. 6 is a graph showing etch traces of different $SiN_x$ materials as discussed in the examples.

FIG. 6 shows etch traces for $SiN_x$ materials of the examples compared to $SiN_x$ materials deposited by plasma enhanced chemical vapor deposition (PECVD) at 150° C. The figure shows that the materials produced by remote microwave plasma deposition demonstrate a strong signal for endpoint etch detection compared to the material deposited by PECVD. Etch traces are the CN (386 nm) optical emission spectra collected by etching in a RIE plasma reactor (using a capacitively coupled plasma source). The parameters used were: 600 Ws (source power)|600 Wb (bias power)|60 mTorr (pressure) |20 sccm $CHF_3$|60 sccm $CF_4$|400 sccm Ar|10 sccm $O_2$.

Figure 7:
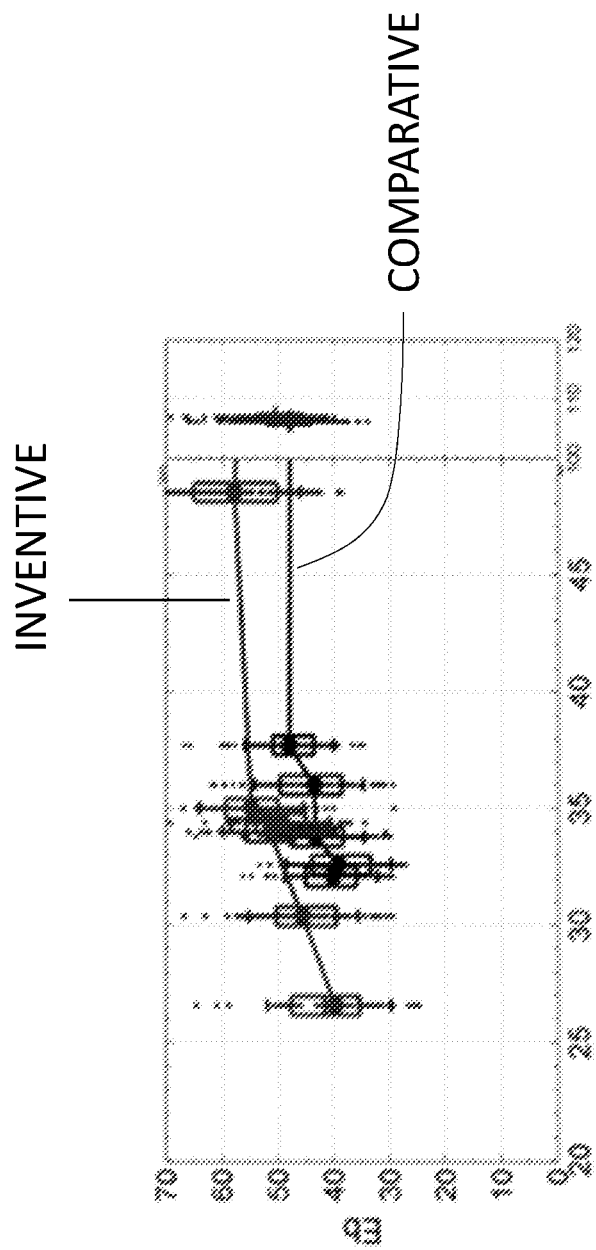
FIG. 7 is a graph showing energy barrier data for different $SiN_x$ materials as discussed in the examples.
Figure 8:
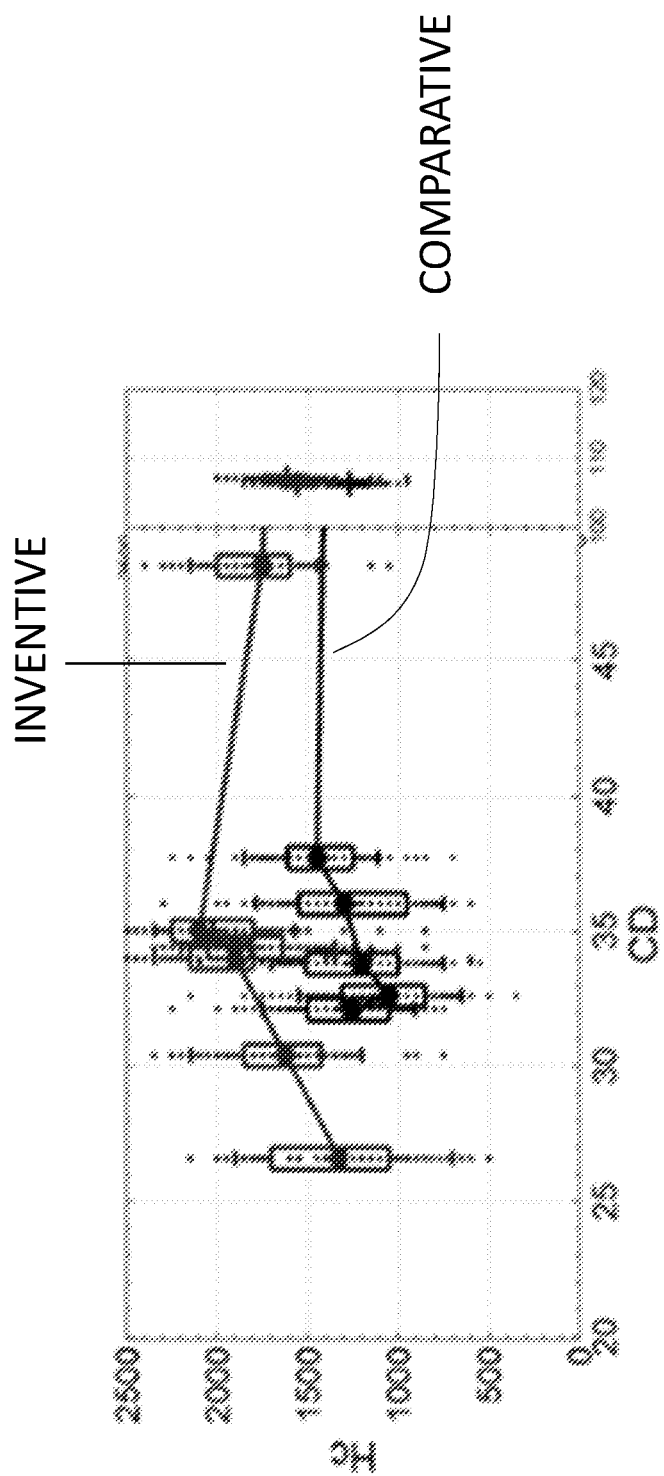
FIG. 8 is graph showing coercivity data for different $SiN_x$ materials as discussed in the examples.

FIG. 8 shows coercivity ($H_c$) ($O_e$) for the $SiN_x$ material having a refractive index of 2.2 as a function of CD (nm) (critical dimension (CD) measured by transmission electron microscopy (TEM)). FIG. 8 also shows coercivity ($H_c$) ($O_e$) for an $SiN_x$ material having a similar refractive index but deposited by plasma enhanced chemical vapor deposition at 200° C. FIG. 7 shows energy barrier data (Eb) for the same materials. Eb data was obtained through fitting the Hc data using Sharrock's formula. Both FIGS. 7 and 8 show that $SiN_x$ materials produced by remote microwave plasma deposition have superior properties to $SiN_x$ materials produced by plasma enhanced chemical vapor deposition at 200° C.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a magnetic random access memory (MRAM) device, the method comprising:
    forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; and
    depositing an encapsulating layer on and along sidewalls of the magnetic tunnel junction at a temperature of 40 to 60° C. using remote microwave plasma deposition, wherein the encapsulation layer comprises silicon and nitrogen.

2. The method of claim 1, wherein the encapsulating layer has a thickness of 10 to 60 nanometers.

3. The method of claim 1, wherein remote microwave plasma deposition uses ammonia and silane as reactant gases.

4. The method of claim 3, wherein the ammonia has a flow rate of 10 to 50 sccm.

5. The method of claim 1, wherein remote microwave plasma deposition uses argon and helium as inert gases.

6. The method of claim 1, wherein the inert gases have a flow rate of 500 to 2300 sccm.

7. The method of claim 1, wherein remote microwave plasma deposition uses microwave power of 2,000 to 6,000 Watts.

8. The method of claim 1, wherein remote microwave plasma deposition is performed at a pressure of 10 mTorr to 1500 mTorr.

9. The method of claim 1, wherein the MUM device is a spin torque transfer MRAM (STT-MRAM) device.

10. A method of making a magnetic random access memory device, the method comprising:
    forming a magnetic tunnel junction on an electrode, the magnetic tunnel junction comprising a reference layer positioned in contact with the electrode, a tunnel barrier layer arranged on the reference layer, and a free layer arranged on the tunnel barrier layer; and
    depositing an encapsulating layer on and along sidewalls of the magnetic tunnel junction wherein the encapsulating layer is formed from $SiH_4$ and $NH_3$ at a temperature of 40 to 60° C. using remote microwave plasma deposition.

11. The method of claim 10, wherein the encapsulating layer has a thickness of 10 to 60 nanometers.

12. The method of claim 10, wherein the ammonia has a flow rate of 10 to 50 sccm.

13. The method of claim 10, wherein remote microwave plasma deposition uses argon and helium as inert gases.

14. The method of claim 10, wherein the inert gases have a flow rate of 500 to 2300 sccm.

15. The method of claim 10, wherein remote microwave plasma deposition uses microwave power of 2,000 to 6,000 Watts.

16. The method of claim 10, wherein remote microwave plasma deposition is performed at a pressure of 10 mTorr to 1500 mTorr.

17. The method of claim 10, wherein the MRAM device is a spin torque transfer MRAM (STT-MRAM) device.

18. A device comprising: a magnetic tunnel junction arranged on an electrode, the magnetic tunnel junction comprising a reference layer positioned in contact with the electrode, a tunnel barrier layer arranged on the reference layer, and a free layer arranged on the tunnel barrier layer; an encapsulating layer contacting a top surface of the free layer, the encapsulating layer being on and along sidewalls of the magnetic tunnel junction wherein the encapsulating layer comprises silicon and nitrogen is formed by remote microwave plasma deposition at a temperature of 40 to 60° C.

19. The device of claim 18, wherein the encapsulating layer has a thickness of 10 to 60 nanometers.

20. The device of claim 18, wherein the encapsulating layer has a refractive index greater than or equal to 2.0.

* * * * *